(12) United States Patent
Tigelaar

(10) Patent No.: US 7,968,950 B2
(45) Date of Patent: Jun. 28, 2011

(54) SEMICONDUCTOR DEVICE HAVING IMPROVED GATE ELECTRODE PLACEMENT AND DECREASED AREA DESIGN

(75) Inventor: Howard Lee Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/769,137

(22) Filed: Jun. 27, 2007

(65) Prior Publication Data

US 2009/0001566 A1 Jan. 1, 2009

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........ 257/396; 257/346; 257/366; 257/387; 257/388; 257/397; 257/E29.001; 257/E29.006

(58) Field of Classification Search .................. 257/346, 257/366, 387–388, 396–397, E20.001, E29.006
See application file for complete search history.

(56) References Cited

U.S. PATENT DOCUMENTS

| | | | | |
|---|---|---|---|---|
| 4,287,571 A * | 9/1981 | Chakravarti et al. | ........... | 365/104 |
| 4,987,465 A * | 1/1991 | Longcor et al. | ............... | 257/357 |
| 5,262,846 A * | 11/1993 | Gill et al. | ....................... | 257/314 |
| 5,270,566 A * | 12/1993 | Fujihara | ........................ | 257/368 |
| 5,589,405 A * | 12/1996 | Contiero et al. | ............. | 438/268 |
| 5,965,921 A * | 10/1999 | Kojima | .......................... | 257/369 |
| 6,034,396 A * | 3/2000 | Wu | ................. | 257/332 |
| 6,037,607 A * | 3/2000 | Hause et al. | ..................... | 257/48 |
| 6,069,390 A * | 5/2000 | Hsu et al. | ........................ | 257/371 |
| 6,091,106 A * | 7/2000 | Park | ............... | 257/330 |
| 6,121,129 A * | 9/2000 | Greco et al. | ................... | 438/622 |
| 6,127,699 A * | 10/2000 | Ni et al. | ........................ | 257/330 |
| 6,274,409 B1 * | 8/2001 | Choi | ............... | 438/128 |
| 6,468,878 B1 * | 10/2002 | Petruzzello et al. | .......... | 438/454 |
| 6,495,422 B1 * | 12/2002 | Yu et al. | ........................ | 438/275 |
| 6,504,213 B1 * | 1/2003 | Ebina | ............................ | 257/347 |
| 6,559,504 B2 * | 5/2003 | Nishibe et al. | ................ | 257/343 |
| 6,649,950 B2 * | 11/2003 | He et al. | ........................ | 257/292 |
| 6,818,950 B1 * | 11/2004 | Mallikarjunaswamy | ..... | 257/340 |
| 6,924,693 B1 * | 8/2005 | Black | ............................ | 327/543 |
| 7,030,446 B2 * | 4/2006 | Madurawe | ..................... | 257/347 |
| 7,122,432 B2 * | 10/2006 | Shimizu et al. | ................ | 438/266 |
| 7,132,331 B2 * | 11/2006 | Jang et al. | ........................ | 438/259 |
| 2001/0012661 A1* | 8/2001 | Lin et al. | ........................ | 438/257 |
| 2002/0074614 A1* | 6/2002 | Furuta et al. | ................... | 257/506 |
| 2006/0006474 A1* | 1/2006 | Tsuboi | .......................... | 257/369 |
| 2008/0093677 A1* | 4/2008 | Kim et al. | ...................... | 257/390 |
| 2008/0157365 A1* | 7/2008 | Ott et al. | ........................ | 257/750 |
| 2009/0321822 A1* | 12/2009 | Knaipp et al. | ................. | 257/335 |

* cited by examiner

*Primary Examiner* — Ida M Soward
(74) *Attorney, Agent, or Firm* — Warren L. Franz; Wade J. Brady, III; Frederick J. Telecky, Jr.

(57) ABSTRACT

A semiconductor device includes a gate electrode having ends that overlap isolation regions, wherein the gate electrode is located over an active region located within a semiconductor substrate. A gate oxide is located between the gate electrode and the active regions, and source/drains are located adjacent the gate electrode and within the active region. An etch stop layer is located over the gate electrode and the gate electrode has at least one electrical contact that extends through the etch stop layer and contacts a portion of the gate electrode that in one embodiment overlies the active region, and in another embodiment is less than one alignment tolerance from the active region.

15 Claims, 3 Drawing Sheets

SEMICONDUCTOR DEVICE HAVING IMPROVED GATE ELECTRODE PLACEMENT AND DECREASED AREA DESIGN

TECHNICAL FIELD

The disclosure is directed, in general, to a semiconductor device and more specifically to a semiconductor device having improved electrical contact to gate electrode placement for decreased area design and a method of manufacture therefore.

BACKGROUND

Sub-micron sized transistors are very well known and are used extensively in all types of electrical devices. It is also well known that these transistors include a gate electrode that overlaps isolation regions on opposite ends of the gate width. As is well accepted by semiconductor manufacturers, electrical contact is made to these transistors by way of an electrical contact plug that extends through an overlying dielectric layer or pre-metal dielectric layer (PMD).

Due to concerns related to minimizing damage to the delicate gate oxide layer that isolates the gate electrodes from the underlying channel region, manufacturers have been careful to place the electrical contacts on that portion of the gate electrodes that overlap the substantially thicker isolation regions. This deliberate placement of the electrical contacts over the isolation regions assures manufacturers that any potential damage to the gate oxide that might occur during use of the dry (plasma) etches, which are often used to form the openings for the electrical contacts, is minimized. When exposed to such dry etch processes, a charge build-up can occur that can severely damage the gate oxide. This concern has remained very much intact, particularly given how device sizes, and correspondingly gate oxide thicknesses, have continued to shrink from one device generation to the next. As such, manufacturers have continued to contact the gates over the isolation regions.

SUMMARY

One embodiment of the invention provides a semiconductor device that comprises a gate electrode having ends that overlap isolation regions, wherein the gate electrode is located over an active region located within a semiconductor substrate. A gate oxide is located between the gate electrode and the active region, and source/drains are located adjacent the gate electrode and within the active region. An etch stop layer is located over the gate electrode and the gate electrode has at least one electrical contact that extends through the etch stop layer and contacts a portion of the gate electrode that overlies the active region.

In another embodiment, there is provided a method of manufacturing a semiconductor device. In this embodiment, the method comprises forming a gate oxide over a semiconductor substrate, forming a gate electrode having ends that overlap isolation regions and located over an active region within the semiconductor substrate. The method also includes forming source/drains adjacent the gate electrode and within the active region, forming an etch stop layer over the gate electrode and forming at least one electrical contact over the gate electrode that extends through the etch stop layer and contacts a portion of the gate electrode that overlies the active region.

Another embodiment provides a semiconductor device that comprises a gate electrode that overlaps an isolation region and is located over an active region within a semiconductor substrate. A gate oxide is located between the gate electrode and the active region, and source/drains are located adjacent the gate electrode and within the active region. An etch stop layer is located over the gate electrode and at least one electrical contact extends through the etch stop layer and contacts the gate electrode outside the active region. An edge of the electrical contact is less than one alignment tolerance from the active region.

Another embodiment provides a method of manufacturing a semiconductor device as just generally described above. This method comprises forming a gate oxide over a semiconductor substrate, forming a gate electrode that overlaps an isolation region and that is located over an active region within the semiconductor substrate. The method also includes forming source/drains adjacent the gate electrode and within the active region, forming an etch stop layer over the gate electrode, and forming at least one electrical contact that extends through the etch stop layer and contacts the gate electrode outside the active region. An edge of the electrical contact is less than one alignment tolerance from the active region.

BRIEF DESCRIPTION OF DRAWINGS

The disclosure is described with reference to example embodiments and to accompanying drawings, wherein.

DETAILED DESCRIPTION

Figure 1A:
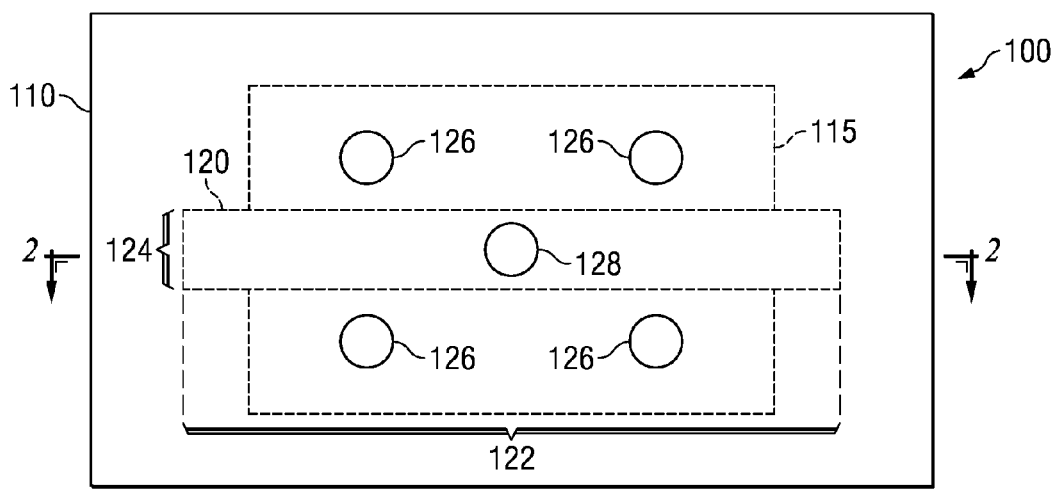
FIGS. 1A-1B illustrate overhead views of embodiments of a semiconductor device of the invention wherein the gate contact is located over the active region.

FIG. 1A illustrates one embodiment of a semiconductor device 100 in accordance with the invention. In this embodiment, the device 100 includes an isolation region 110. The isolation region 110 may be conventionally formed and may include conventional structures, such as trench isolation or field oxide features. The isolation region 110 isolates an active region 115 from an adjacent device, which is not shown in this view. An active region is a region of the device 100 that includes source/drains and a conductive well in which a conductive channel is formed in response to an applied voltage. It should be noted that the various embodiments of the invention may include one or more gate electrodes and gate contacts as described herein.

A gate electrode 120, whose width 122 extends across the active region 115, overlaps the isolation region 110. The gate electrode 120 may also be of conventional design and may be conventionally formed. For example, the gate electrode 120 may be comprised of a doped polysilicon, or it may be comprised of a metal, a metal silicide, or a combination of any of these materials. In certain embodiments, such as the one illustrated in FIG. 1A, the gate electrode 120 may be located in a high voltage, input/output (I/O) area of the device 100. In such instances, the gate electrode 120 has a length 124 that is wider than gate electrodes located in lower voltage or core areas of the device 100.

The device 100 further includes two or more source/drain electrical contacts 126, such as contact plugs, that respectively contact source and drain regions of the device 100. The electrical contacts 126 may be formed using conventional processes and materials. The embodiment of the device 100 further includes a gate electrical contact 128, which may also be formed using conventional processes and materials. However, one beneficial aspect of this embodiment is that the contact 128 is located within the active region 115. This is contrary to conventional devices where the gate contacts are located well outside the active region. In fact, industry standards require the gate contact to be offset from the active region by at least one alignment tolerance.

In the illustrated embodiment, the contact 128 is shown to be placed in the middle of the width 122 of the gate electrode 120. However, other embodiments provide that the contact 128 may be placed at any point along the width 122 of the gate electrode 120 that is located over the active region 115. This embodiment is based on the present recognition that, contrary to conventional processes, the contact 128 can be placed over the gate oxide without causing damage to it. The reasons for this are explained below with respect to FIG. 2. Since the contact 128 can now be placed on that portion of the gate electrode 120 that is located over the active region 115, the design rules that require the contacts to be placed a minimum set distance from the active region are no longer required. As such, devices can be moved closer together and component density can, thereby, be increased.

Figure 1B:
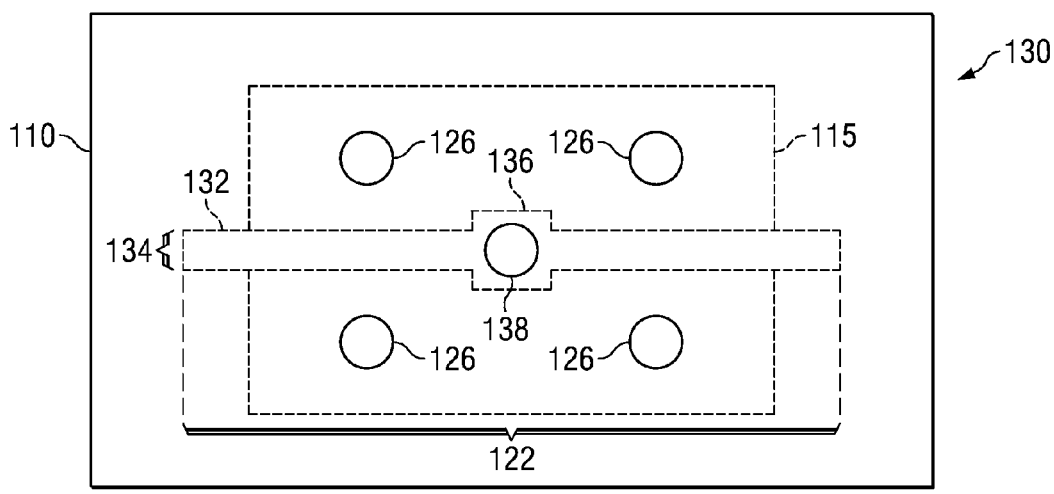

FIG. 1B is an alternative embodiment of the semiconductor device 100 of FIG. 1A. In this embodiment, the semiconductor device 130 comprises the same isolation region 110, active region 115, and source/drain contacts 126 as the device 100. However, the gate electrode 132 in this embodiment is configured for a low voltage, core transistor. As such it has a narrower gate length 134, but the same gate width 122 as device 100, and includes a contact pad 136 on which a gate electrical contact 138 is located. The pad 136 is beneficial in this embodiment because it assures proper contact with the narrower gate electrode 132 and avoids the possibility of the gate contact shorting to the source or drain if the contact is misaligned to the narrow gate. It should be noted that the pad 136 may be located anywhere along the width 122 and within the active region 115. As with the previous embodiment, conventional processes and materials may be used to form the gate electrode 132 and the contact 138. Further, the contact pad 136 may form a portion of the gate electrode 132, or it may be separately fabricated.

Figure 2:
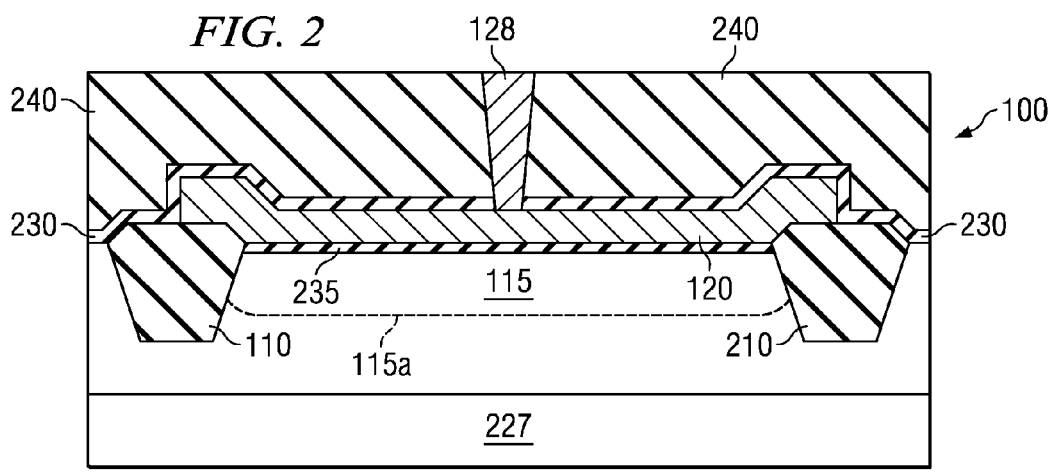
FIG. 2 illustrates a section view taken through line 2-2 of FIG. 1A.

FIG. 2 is a representative sectional view of the embodiment of FIG. 1A taken along the line 2-2, which presents advantageous aspects of the semiconductor device 100 that cannot be seen in FIG. 1A. In this view, the isolation regions 110, active region 115, which may be either a source or drain 115a (extending perpendicular to the page and represented by the dashed line), gate electrode 120, and gate electrical contact 128 are seen, all of which are located over a semiconductor substrate 227. In addition, however, a pre-metal dielectric layer 240, such as an oxide layer, an etch stop layer 230, such as a silicon nitride layer, and gate oxide 235, which is located under the gate electrode 120, can be seen. The etch stop layer 230 and gate oxide 235 may be conventionally formed using known materials and processes. However, with the invention, it has been recognized that the presence of the etch stop layer 230 allows the contact 128 to be formed over the gate oxide 235, and thus the active region 115 even though the gate oxide is relatively thin (e.g., having a thickness of about 1.5 nm or less).

In conventional processes, manufacturers have not placed the contact 128 over the active region 115 for fear that the gate oxide would be damaged. In conventional processes, the contact opening is typically etched in dielectric layer 240 using a dry or plasma etch process. In former and larger technologies, gate oxides were thicker to accommodate the larger transistors and gate voltages. As such, the gate electrode could retain or build-up sufficient electrical charge from the plasma to cause dielectric breakdown of the gate oxide, thereby irreparably damaging it. As gate oxides have become thinner with decreasing device size, they have also become more leaky. The invention recognizes that due to the increased leakiness of the gate oxides, the gate electrode no longer develops a high enough voltage to cause dielectric breakdown of the gate oxide. The semiconductor manufacturing industry has failed to fully appreciate the significance of this characteristic of the current gate oxides. Thus, plasma processes can now be used to form contact openings over the gate oxide 235, and thus, the active region 115. Additionally, it is also presently recognized that the presence of the etch stop layer and the improvements in the controllability of etching processes also allows the formation of the contact 128 over the active region 115 without causing significant damage to the underlying gate oxide 225.

These recognitions provide a process whereby the contact 128 can now be located over the active region 115, thereby eliminating the need to place contacts and contact pads on opposite ends of the gate electrode 120, which in turn, saves fabrication area on the wafer. Inasmuch as semiconductor processes are beginning to run into photolithographic limitations in achieving further size reduction, particularly as devices scale below 32 nm, increased component density will become more difficult to achieve. The above-discussed embodiments provide manufacturers a way to save additional space across the wafer that can be used for further component densification. For example, it is believed that in certain SRAM cell designs, the length of one axis of the unit cell can be reduced by approximately 80 nm, or more, using the various embodiments discussed herein. This results in a reduction of the area required by the cell and an increase of the SRAM cell density. It should be noted, however, that the amount of area savings will depend on the circuit design. Nevertheless, additional wafer space for additional component fabrication can be achieved using the principles of the invention.

Figure 3A:
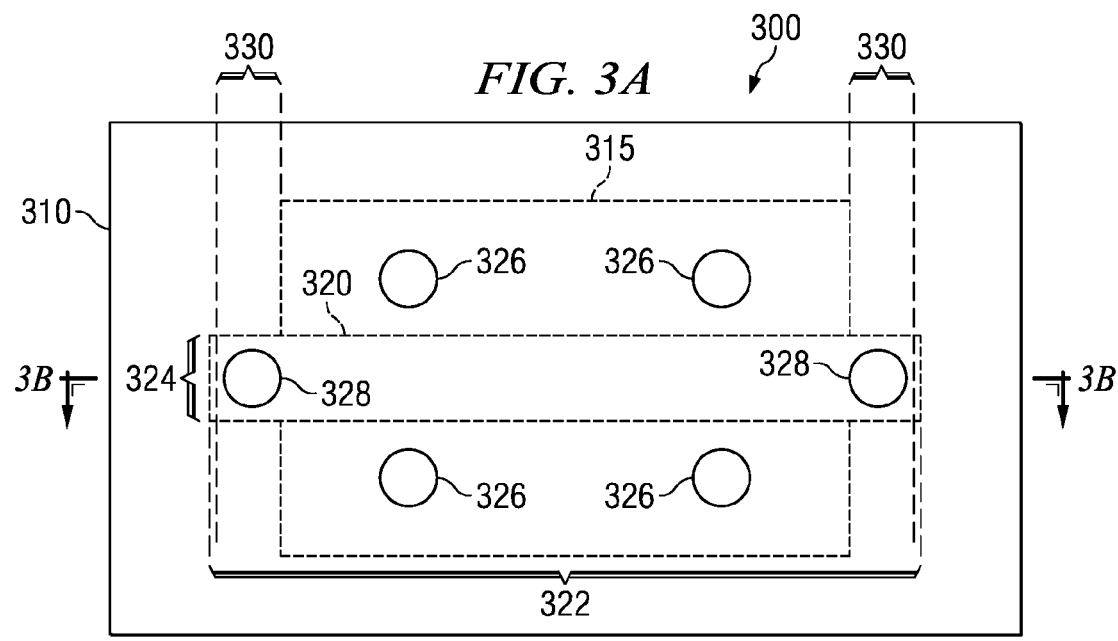
FIG. 3A illustrates an alternative embodiment wherein the gate contact is located less than one alignment tolerance from the active region.

FIG. 3A represents an alternative embodiment as provided by the invention. In this embodiment the semiconductor device 300 includes the same structural components as the embodiments described above with the exception of the location of the gate electrode contacts, as explained below. The device 300 includes an isolation region 310. The isolation region 310 may be conventionally formed and may include conventional structures, such as trench isolation or field oxide features. The isolation region 310 isolates an active region 315 from an adjacent device, which is not shown. An active region has the same meaning as set forth above for other embodiments.

A gate electrode 320, whose width 322 extends across the active region 315, overlaps the isolation region 310. The gate electrode 320 may also be of conventional design and may be conventionally formed. For example, the gate electrode 320 may be comprised of a doped polysilicon, or it may be comprised of a metal, a metal silicide, or a combination of any of these materials. In certain embodiments, such as the one illustrated in FIG. 3A, the gate electrode 320 may be located in a high voltage, input/output (I/O) area of the device 300. In such instances, the gate electrode 320 has a length 324 that is wider than gate electrodes located in lower voltage or core areas of the device 300. In such instances, the length 324 may be sufficient to eliminate the need for of contact pads.

The device 300 further includes two or more source/drain electrical contacts 326, such as contact plugs, that respectively contact source and drain regions of the device 300. The electrical contacts 326 may be formed using conventional processes and materials. The embodiment of the device 300 further includes one or more gate electrical contacts 328, which may also be formed using conventional processes and materials. However, one beneficial aspect of this embodiment is that the contacts 328, as measured from their edges closest to the active region 315, are located a distance that is less than one alignment tolerance 330 from the active region 315. This is contrary to conventional devices where the edge of the gate contacts would be located at least a distance from the active region 315 to the outer most dashed line of the alignment tolerance 330. Moreover, it is counter-intuitive that manufacturers would intentionally locate a feature as provided by this embodiment, because it would violate the very purpose of the alignment tolerance rules, which is to insure proper overlap of overlying features and proper offset from adjacent features.

As used herein, an alignment tolerance is a maximum expected variation of the location of a design feature in a semiconductor device relative to a reference feature. A reference feature may, for example, be an alignment mark or functional feature of an underlying mask level. The maximum variation typically includes a contribution from a photolithography tool used to print the design feature, and a contribution from a photolithographic mask that includes the design feature. The alignment tolerance is typically reduced as the photolithographic equipment is improved in subsequent semiconductor technology generations. It also should be understood that the alignment tolerance will vary depending on the photolithographic tool used.

In the illustrated embodiment of FIG. 3A, the gate electrode 320 has a length 324 that is sufficient to allow contact to the electrode to be achieved without the use of a contact pad. This "contact pad-less" version is beneficial because the omission of the bond pad allows manufacturers to gain additional wafer space on which additional components can be manufactured, though other embodiments do not preclude the use of bond pads. Furthermore, since the contacts 328 are positioned a distance that is less than one alignment tolerance 330 from the active region 315, greater component fabrication area savings can be achieved.

Figure 3B:
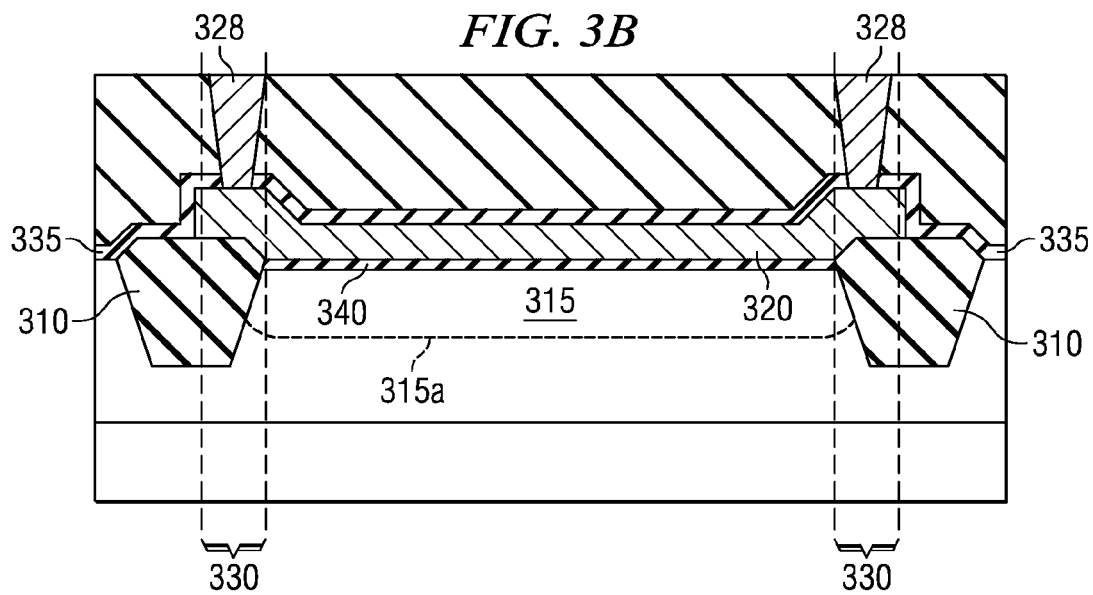
FIG. 3B illustrates a section view taken through line 3B-3B of FIG. 3A.

FIG. 3B is a representative sectional view taken along the line 3B-3B of FIG. 3A, which illustrates the distance relationship of the contacts 328 to the active region 315, and how the contacts 328 are located a distance that is less than one alignment tolerance from the active region 315. In this view, the isolation regions 310, active region 315, which may be either a source or drain 315a (extending perpendicular to the page and represented by the dashed line), gate electrode 320, and gate contact 328 are seen. In addition, however, an etch stop layer 335, such as a silicon nitride layer, and gate oxide 340, which is located under the gate electrode 320, can be seen. The etch stop layer 335 and gate oxide 340 may be conventionally formed using known processes and materials.

Figure 4:
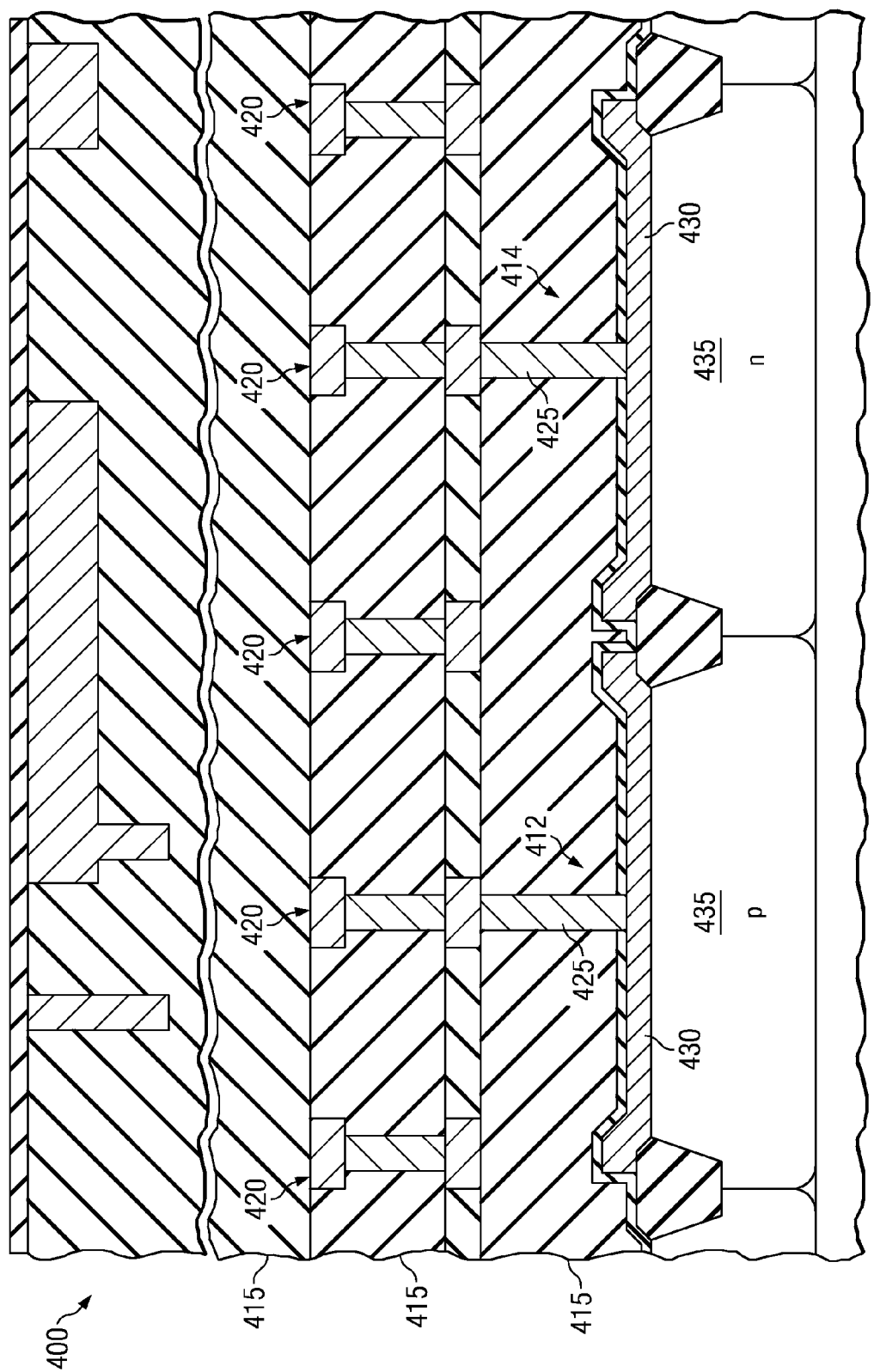
FIG. 4 illustrates a sectional view of an integrated circuit (IC) incorporating the semiconductor device of the disclosure.

FIG. 4 illustrates a cross-sectional view of an integrated circuit (IC) 400 incorporating the device shown in the embodiment of FIGS. 1A and 2. FIG. 4 illustrates the transistors 412, 414 of FIG. 2 incorporated into the integrated circuit (IC) 400. In the illustrated embodiment, the IC 400 includes complementary NMOS transistor 412 and PMOS transistor 414, which may be manufactured as discussed above. Overlying the transistors 412, 414 are dielectric layers 415 that may be conventionally formed, and interconnects 420, including contacts, that are located over and within the dielectric layers 415. The interconnects 420 may be also be conventional and may include damascene or dual damascene structures, both of which are shown for illustrative purposes. As seen in this embodiment, the IC 400 shows the gate electrode contact 425 contacting that portion of gate electrode 430 which is located over active region 435, as discussed above. It should be recognized that although the embodiments of FIGS. 1A and 2 are shown incorporated into the IC 400, the embodiments of FIG. 1B or FIGS. 3A and 3B may likewise be incorporated into the IC 400.

Those skilled in the art to which the disclosure relates will appreciate that other and further additions, deletions, substitutions, and modifications may be made to the described example embodiments, without departing from the disclosure.

What is claimed is:

1. A semiconductor device, comprising:
  a gate electrode having opposing ends that overlap isolation regions and wherein the gate electrode is located over an active region located within a semiconductor substrate;
  a gate oxide located between the gate electrode and the active region, wherein the gate oxide has a thickness of about 1.2 nm or less;
  source/drains located adjacent the gate electrode and within the active region, a transistor channel region being defined under the gate electrode in the active region between the source/drains;
  an etch stop layer located over the gate electrode; and
  at least one electrical contact that extends through the etch stop layer and contacts a portion of the gate electrode located between the isolation regions and that overlies the channel region in the active region.

2. The device of claim 1, further comprising a dielectric layer located over the etch stop layer; and wherein the at least one electrical contact extends vertically through at least a portion of the dielectric layer and through the etch stop layer to contact the gate electrode at the location that overlies the active region.

3. The device of claim 2, wherein the gate electrode comprises at least one of doped polysilicon or metal silicide.

4. The device of claim 2, wherein the etch stop layer comprises silicon nitride.

5. A semiconductor device, comprising:
  a gate electrode having opposing ends that overlap isolation regions and wherein the gate electrode is located over an active region located within a semiconductor substrate;
  a gate oxide located between the gate electrode and the active region;
  source/drains located adjacent the gate electrode and within the active region, a transistor channel region being defined under the gate electrode in the active region between the source/drains;
  an etch stop layer located over the gate electrode; and
  at least one electrical contact that extends through the etch stop layer and contacts a portion of the gate electrode located between the isolation regions and that overlies the channel region in the active region;
  wherein the gate electrode includes a contact pad; and
  wherein the at least one electrical contact contacts the gate electrode at the contact pad.

6. The device of claim 5, wherein the at least one electrical contact contacts the gate electrode at the middle of the width of the gate electrode.

7. The device of claim 5, further comprising a dielectric layer located over the etch stop layer; and wherein the at least one electrical contact extends vertically through at least a portion of the dielectric layer and through the etch stop layer to contact the gate electrode at the location that overlies the active region.

8. The device of claim 7, wherein the etch stop layer comprises silicon nitride, and the gate electrode comprises at least one of doped polysilicon or metal silicide.

9. A method of manufacturing a semiconductor device, comprising:
   forming a gate oxide over a semiconductor substrate, wherein the gate oxide has a thickness that is about 1.2 nm or less;
   forming a gate electrode over the gate oxide, wherein opposing ends of the gate electrode overlap isolation regions and the gate electrode is located over an active region within the semiconductor substrate;
   forming source/drains adjacent the gate electrode and within the active region, a transistor channel region being defined under the gate electrode in the active region between the source/drains;
   forming an etch stop layer over the gate electrode; and
   forming at least one electrical contact that extends through the etch stop layer and contacts a portion of the gate electrode that overlies the channel region in the active region.

10. The method of claim 9, further comprising forming a dielectric layer over the etch stop layer; and wherein forming the at least one electrical contact comprises forming the at least one electrical contact to extend vertically through at least a portion of the dielectric layer and through the etch stop layer to contact the gate electrode at the location that overlies the active region.

11. The method of claim 10, wherein forming the at least one electrical contact comprises forming a contact opening over the gate oxide in at least the dielectric layer using a plasma process.

12. The method of claim 11, wherein the etch stop layer comprises silicon nitride, and the gate electrode comprises at least one of doped polysilicon or metal silicide.

13. The method of claim 9, further comprising forming a dielectric layer over the etch stop layer; and wherein forming the at least one electrical contact comprises forming a contact opening over the gate oxide in at least the dielectric layer using a plasma process.

14. A method of manufacturing a semiconductor device, comprising:
   forming a gate oxide over a semiconductor substrate;
   forming a gate electrode wherein opposing ends of the gate electrode overlap isolation regions and the gate electrode is located over an active region within the semiconductor substrate;
   forming source/drains adjacent the gate electrode and within the active region, a transistor channel region being defined under the gate electrode in the active region between the source/drains;
   forming an etch stop layer over the gate electrode; and
   forming at least one electrical contact that extends through the etch stop layer and contacts a portion of the gate electrode that overlies the channel region in the active region;
   wherein the gate electrode is formed with a contact pad; and the at least one electrical contact is formed to contact the gate electrode at the contact pad.

15. The method of claim 14, wherein the at least one electrical contact is formed to contact the gate electrode in the middle of the width of the gate electrode.

* * * * *